United States Patent
Jang et al.

(10) Patent No.: US 9,438,176 B2
(45) Date of Patent: Sep. 6, 2016

(54) LOW NOISE AMPLIFIER

(71) Applicant: Industry-Academic Cooperation Foundation, Yonsei University, Seoul (KR)

(72) Inventors: Junyoung Jang, Seoul (KR); Honggul Han, Busan (KR); Tae Wook Kim, Seoul (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 11 days.

(21) Appl. No.: 14/256,191

(22) Filed: Apr. 18, 2014

(65) Prior Publication Data

US 2014/0312973 A1 Oct. 23, 2014

(30) Foreign Application Priority Data

Apr. 19, 2013 (KR) .................. 10-2013-0043593

(51) Int. Cl.
*H03F 3/45* (2006.01)
*H03F 1/26* (2006.01)
*H03F 1/32* (2006.01)

(52) U.S. Cl.
CPC ............ *H03F 1/26* (2013.01); *H03F 3/45179* (2013.01); *H03F 1/32* (2013.01); *H03F 2200/294* (2013.01); *H03F 2203/45306* (2013.01); *H03F 2203/45318* (2013.01)

(58) Field of Classification Search
CPC .......... H03F 3/45; H03F 1/26; H03F 1/3247; H03F 2200/372

USPC ......... 330/277, 310, 296, 297, 311, 252–261
See application file for complete search history.

(56) References Cited

U.S. PATENT DOCUMENTS

| | | | | |
|---|---|---|---|---|
| 5,091,701 A | * | 2/1992 | Butler | H03F 1/3211 330/252 |
| 5,469,104 A | * | 11/1995 | Smith et al. | 327/491 |
| 5,525,930 A | * | 6/1996 | Pothast | H03F 1/083 330/252 |
| 7,598,788 B2 | | 10/2009 | Cao | |
| 7,741,910 B2 | * | 6/2010 | Wong | 330/260 |
| 8,570,106 B2 | * | 10/2013 | Kim et al. | 330/291 |

(Continued)

FOREIGN PATENT DOCUMENTS

| | | | | |
|---|---|---|---|---|
| JP | H06204762 A | | 7/1994 | |
| JP | 1020060090700 | * | 3/2008 | ............... H03F 3/45 |
| KR | 10-2008-0025910 A | | 3/2008 | |

(Continued)

OTHER PUBLICATIONS

Yeo Myung Kim, et al., "A 0.6-V +4 dBm IIP3 LC Folded Cascode CMOS LNA With gm Linearization", IEEE Transactions on Circuits and Systems-II: Express Briefs, vol. 60, No. 3, Mar. 2013, pp. 122-126.

*Primary Examiner* — Steven J Mottola
*Assistant Examiner* — Hafizur Rahman
(74) *Attorney, Agent, or Firm* — Carter, DeLuca, Farrell & Schmidt, LLP

(57) ABSTRACT

Provided is a low noise amplifier. The low noise amplifier includes an input transistor receiving and amplifying a signal, an output transistor amplifying the signal amplified by the input transistor, and an inverting unit inverting the signal which is amplified by the input transistor and applying the inverted signal to a gate of the output transistor.

6 Claims, 4 Drawing Sheets

(56) References Cited

U.S. PATENT DOCUMENTS

2009/0179706 A1    7/2009    Wong
2010/0308914 A1    12/2010    Kuo et al.

FOREIGN PATENT DOCUMENTS

KR      20090031083 A    3/2009
KR      1020090123954 A    12/2009

* cited by examiner

LOW NOISE AMPLIFIER

CROSS-REFERENCE TO RELATED APPLICATIONS

This U.S. non-provisional patent application claims priority under 35 U.S.C. §119 of Korean Patent Application No. 10-2013-0043593, filed on Apr. 19, 2013, the entire contents of which are hereby incorporated by reference.

BACKGROUND OF THE INVENTION

The present invention disclosed herein relates to a low noise amplifier.

Low noise amplifiers are circuits for suppressing noises and amplifying signals. The low noise amplifiers may be used to amplify signals which are received by antennas at receivers without distortion to reduce noise index of the entire receivers.

To amplify signals without distortion, the low noise amplifiers are needed to have high linearity. However, transistors are being reduced in sizes to integrate circuits, and accordingly, power supply voltages applied to the transistors are being reduced. As a result, a third-order drain conductance $g_{d3}$ affecting the nonlinearity of the low noise amplifier increases to make it difficult for typical low noise amplifiers to maintain high linearity.

SUMMARY OF THE INVENTION

Embodiments of the present invention provide a low noise amplifier having high linearity.

Embodiments of the present invention also provide a low noise amplifier having high linearity even when a low power supply voltage is applied thereto.

Embodiments of the present invention also provide a low noise amplifier having a low power consumption and high linearity.

Embodiments of the present invention provide low noise amplifiers including: an input transistor receiving and amplifying a signal; an output transistor amplifying the signal amplified by the input transistor; and an inverting unit inverting the signal which is amplified by the input transistor, and applying the inverted signal to a gate of the output transistor.

In some embodiments, the input transistor and the output transistor may be connected to each other in a cascade configuration.

In some embodiments, the input transistor and the output transistor may be connected to each other in a cascode configuration.

In other embodiments, the input transistor and the output transistor may be connected to each other in a folded cascode configuration.

In still other embodiments, the inverting unit may include an invert-amplifying transistor which receives, through a gate thereof, the signal amplified by the input transistor, and invert and amplify the received signal to output the inverted amplified signal through a drain thereof.

In even other embodiments, the invert-amplifying transistor may have a gate connected to an output terminal of the input transistor through a capacitor, and a drain connected to the gate of the output transistor.

In yet other embodiments, the input transistor may include first and second transistors which receive and amplify a differential input signal, and the output transistor may include third and fourth transistors which amplify signals amplified by the first and second transistors.

In further embodiments, the inverting unit may include fifth and sixth transistors which invert and amplify the signals amplified by the first and second transistors and apply the inverted amplified signals to gates of the third and fourth transistors.

In still further embodiments, the fifth and sixth transistors may be configured as common source amplifiers.

In even further embodiments, the inverting unit may include an output cross-coupling unit connecting the third transistor to the fourth transistor in a cross-coupled configuration.

In yet further embodiments, the output cross-coupling unit may apply the signal amplified by the first transistor to a gate of the fourth transistor, and apply the signal amplified by the second transistor to a gate of the third transistor.

In much further embodiments, the output cross-coupling unit may be configured such that an output terminal of the first transistor is connected to a gate of the fourth transistor through a capacitor, and an output terminal of the second transistor may be connected to a gate of the third transistor through a capacitor.

In still much further embodiments, the low noise amplifiers may further include an input cross-coupling unit connecting the first transistor and the second transistor to each other in a cross-coupled configuration.

In even much further embodiments, the input cross-coupling unit may apply the signal, which is input to the first transistor, to a gate of the second transistor, and apply the signal, which is input to the second transistor, to a gate of the first transistor.

In yet much further embodiments, the input cross-coupling unit may be configured such that an input terminal of the first transistor is connected to a gate of the second transistor through a capacitor, and an input terminal of the second transistor may be connected to a gate of the first transistor through a capacitor.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. The word 'and/or' means that one or more or a combination of relevant constituent elements is possible.

Hereinafter, example embodiments will now be described more fully with reference to the accompanying drawings.

Figure 1:
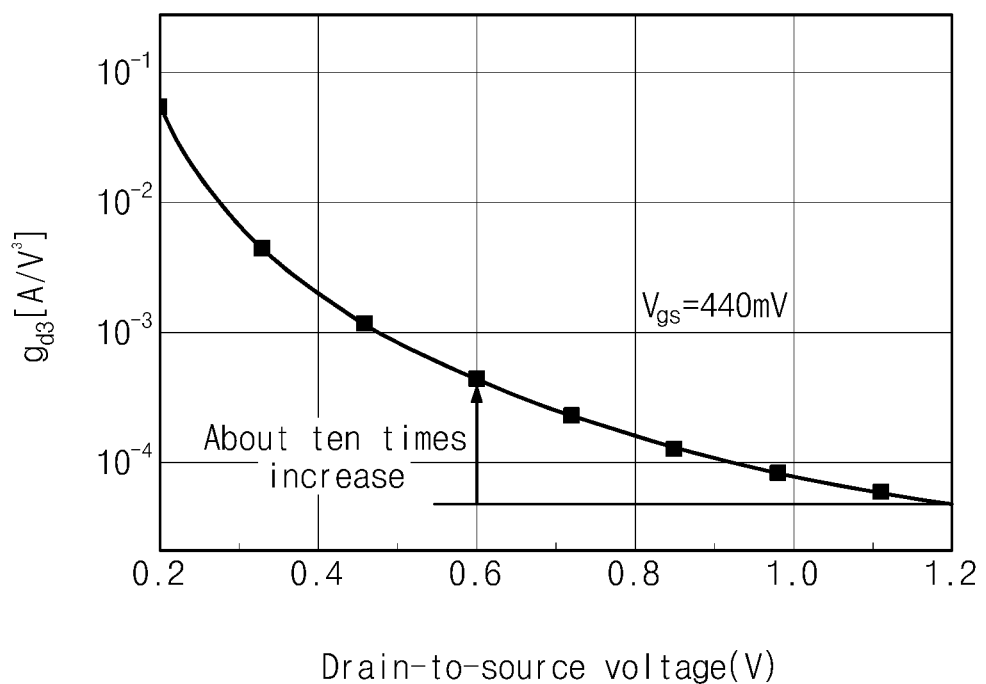
FIG. 1 is a graph illustrating a relationship between a drain-source voltage $V_{DS}$ and a third-order drain conductance $g_{d3}$ of a transistor.

FIG. 1 is a graph illustrating a relationship between a drain-source voltage $V_{DS}$ and a third-order drain conductance $g_{d3}$ of a transistor.

As illustrated in FIG. 1, when the drain-source voltage $V_{DS}$ applied to the transistor decreases, the third-order drain conductance $g_{d3}$ increases. For example, when the drain-source voltage $V_{DS}$ decreases from 1.2 V to 0.6 V, the third-order drain conductance go may increase by about ten times.

The third-order drain conductance $g_{d3}$ is a factor affecting the nonlinearity of the transistor. Thus, the more the third-order drain conductance $g_{d3}$ increases, the more the linearity of the transistor increases. Therefore, the lower power supply voltage supplied to the transistor leads to an increase in the linearity of the transistor, and thus it is difficult to secure the desired performance from a circuit using the transistor.

Figure 2:
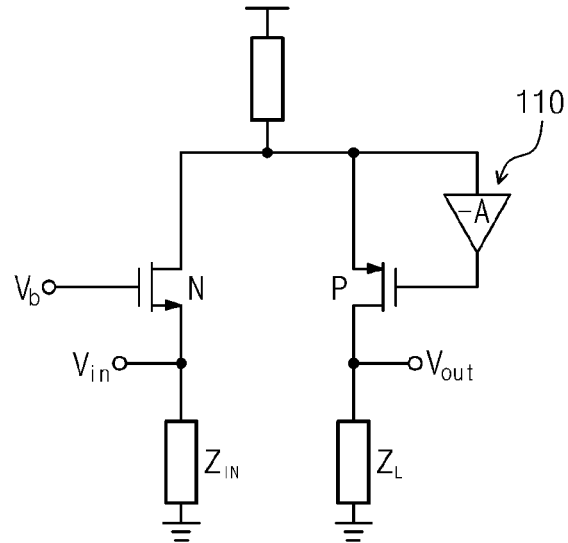
FIG. 2 is a circuit diagram of a low noise amplifier according to an embodiment of the present invention.

FIG. 2 is a circuit diagram of a low noise amplifier according to an embodiment of the present invention.

As illustrated in FIG. 2, the low noise amplifier 100 according to the embodiment of the present invention may include an input transistor N, an output transistor P, and an inverting unit 110.

The input transistor N may receive and amplify a signal. The output transistor P may amplify the signal amplified by the input transistor N. The inverting unit 110 may invert the signal amplified by the input transistor N to apply the inverted signal to a gate of the output transistor P.

According to the embodiment, the input transistor N and the output transistor P may be connected to each other in a cascode configuration. For example, as illustrated in FIG. 2, the input transistor N and the output transistor P may be connected to each other in a folded cascode configuration.

In this case, the input transistor N may be an n-channel metal oxide semiconductor (NMOS) transistor and the output transistor P may be a p-channel metal oxide semiconductor (PMOS) transistor; however types of transistors are not limited thereto.

As illustrated in FIG. 2, the input transistor N may receive the signal through a source to output the amplified signal through a drain. A bias voltage $V_b$ may be applied to a gate of the input transistor N.

Also, as illustrated in FIG. 2, the output transistor P may receive the signal through a source to output the amplified signal through a drain. An inversion signal obtained by inverting the signal amplified by the input transistor N may be applied into the gate of the output transistor P.

According to the embodiment, the inverting unit 110 may have a gain of −A times value, where A may be equal to or greater than 1. When A is greater than 1, the inverting unit 110 inverts and amplifies the signal amplified by the input transistor N and then apply the inverted amplified signal to the gate of the output transistor P.

As a result, a driving impedance of the output transistor P increases, i.e., $G_m=(1+A)g_m$, and a driving impedance of the input transistor N decreases, i.e., $1/(1+A)g_m$. This enables the linearity of the low noise amplifier 100 to increase.

Figure 3:
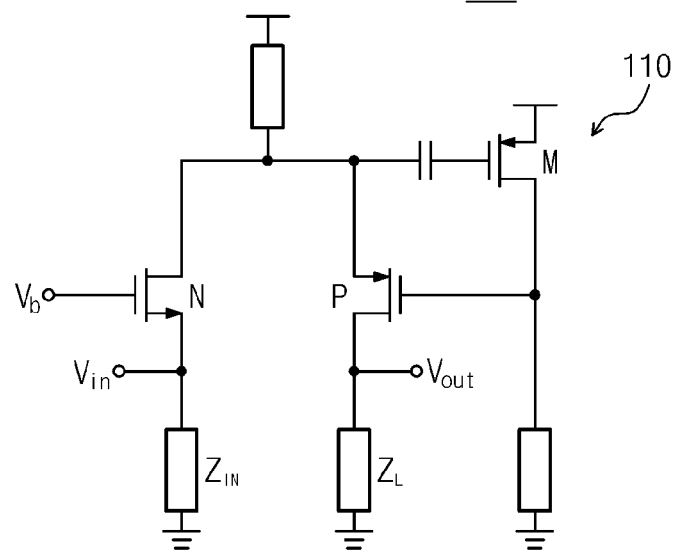
FIG. 3 is a circuit diagram of a low noise amplifier according to another embodiment of the present invention.

FIG. 3 is a circuit diagram of a low noise amplifier according to another embodiment of the present invention.

As illustrated in FIG. 3, an inverting unit 110 of the low noise amplifier 200 may include an invert-amplifying transistor M which receives, through a gate thereof, a signal amplified by an input transistor N and inverts and amplifies the received signal to thereby output the inverted amplified signal through a drain thereof.

As illustrated in FIG. 3, the invert-amplifying transistor M has the gate connected to an output terminal of the input transistor N through a capacitor and the drain connected to a gate of an output transistor P.

Figure 4:
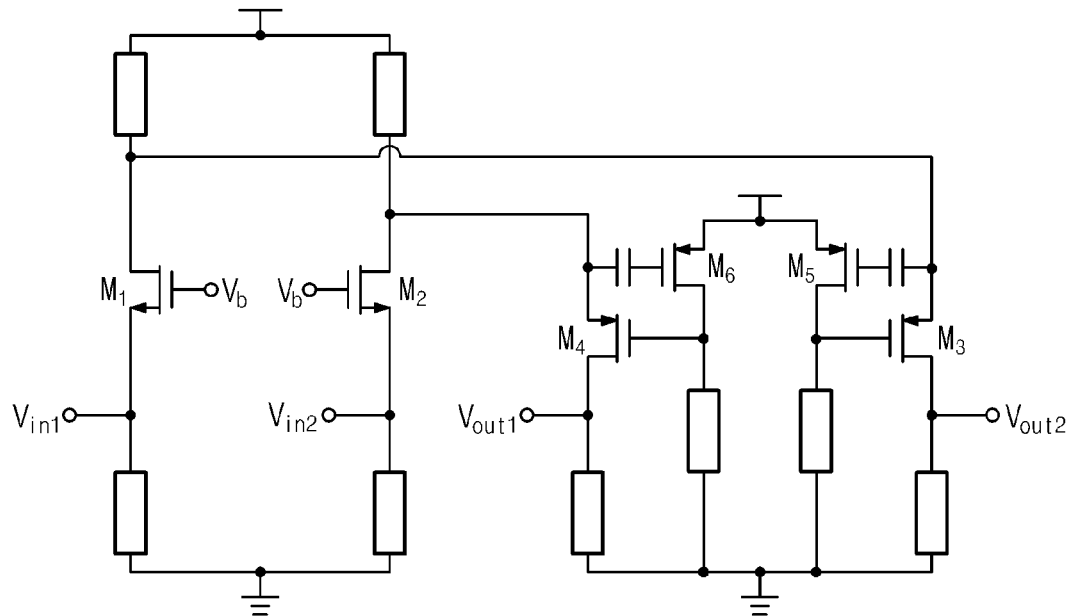
FIG. 4 is a circuit diagram of a low noise amplifier according to another embodiment of the present invention.

FIG. 4 is a circuit diagram of a low noise amplifier according to another embodiment of the present invention.

As illustrated in FIG. 4, an input transistor of the low noise amplifier 300 may include a first transistor $M_1$ and a second transistor $M_2$ which receive and amplify a differential input signal. Also, an output transistor of the low noise amplifier 300 may include a third transistor $M_3$ which amplifies the signal amplified by the first transistor $M_1$ and a fourth transistor $M_4$ which amplifies the signal amplified by the second transistor $M_2$.

A bias voltage $V_b$ may be applied to gates of the first and second transistors $M_1$ and $M_2$.

According to this embodiment, an inverting unit 110 of the low noise amplifier 300 may include a fifth transistor $M_5$ which inverts and amplifies the signal amplified by the first transistor $M_1$ to apply the inverted amplified signal to a gate of the third transistor $M_3$, and a sixth transistor $M_6$ which inverts and amplifies the signal amplified by the second transistor $M_2$ to apply the inverted amplified signal to a gate of the fourth transistor $M_4$.

As illustrated in FIG. 4, the fifth and sixth transistors $M_5$ and $M_6$ may be configured as common source amplifiers.

A gate of the fifth transistor M5 may be connected to an output terminal of the first transistor M1 through a capacitor, and a gate of the sixth transistor M6 may be connected to an output terminal of the second transistor M2 through a capacitor.

Figure 5:
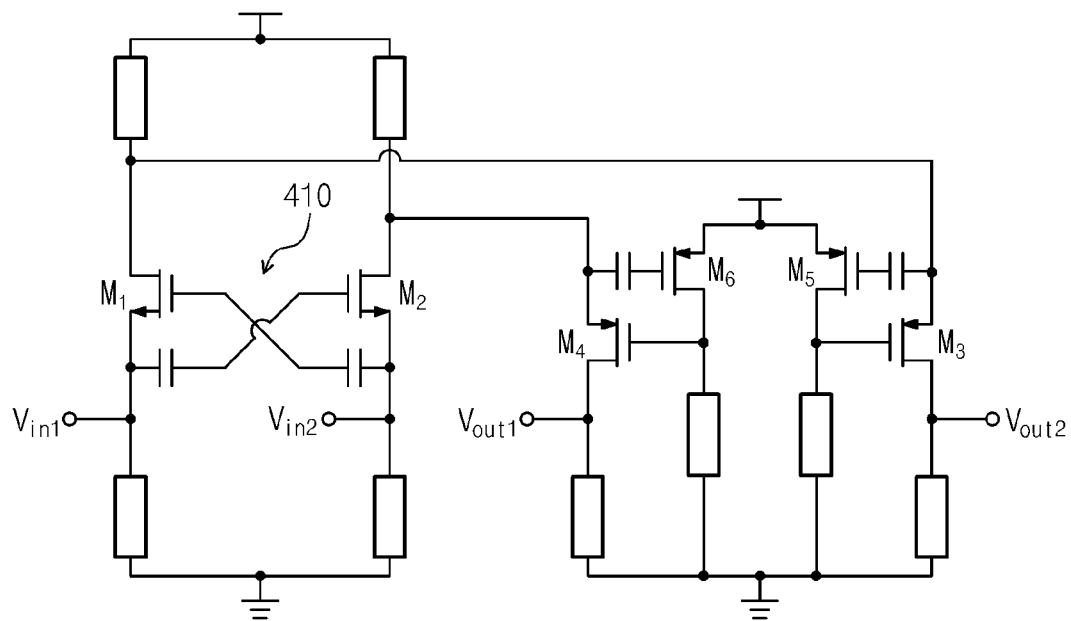
FIG. 5 is a circuit diagram of a low noise amplifier according to another embodiment of the present invention.

FIG. 5 is a circuit diagram of a low noise amplifier according to another embodiment of the present invention.

Unlike the low noise amplifier 300 illustrated in FIG. 4, the low noise amplifier 400 illustrated in FIG. 5 may further include an input cross-coupling unit 410 connecting a first transistor $M_1$ to a second transistor $M_2$ in a cross-coupled configuration.

The input cross-coupling unit 410 may apply a signal, which is input to the first transistor $M_1$, to a gate of the second transistor $M_2$, and apply a signal, which is input to the second transistor $M_2$, to a gate of the first transistor $M_1$.

For example, as illustrated in FIG. 5, the input cross-coupling unit 410 may connect an input terminal of the first transistor $M_1$ to the gate of the second transistor $M_2$ through a capacitor, and connect an input terminal of the second transistor $M_2$ to the gate of the first transistor $M_1$ through a capacitor.

As in this embodiment, when the input transistors are connected to each other in a cross-coupled configuration, the power consumption of the low noise amplifier 400 may decrease.

Figure 6:
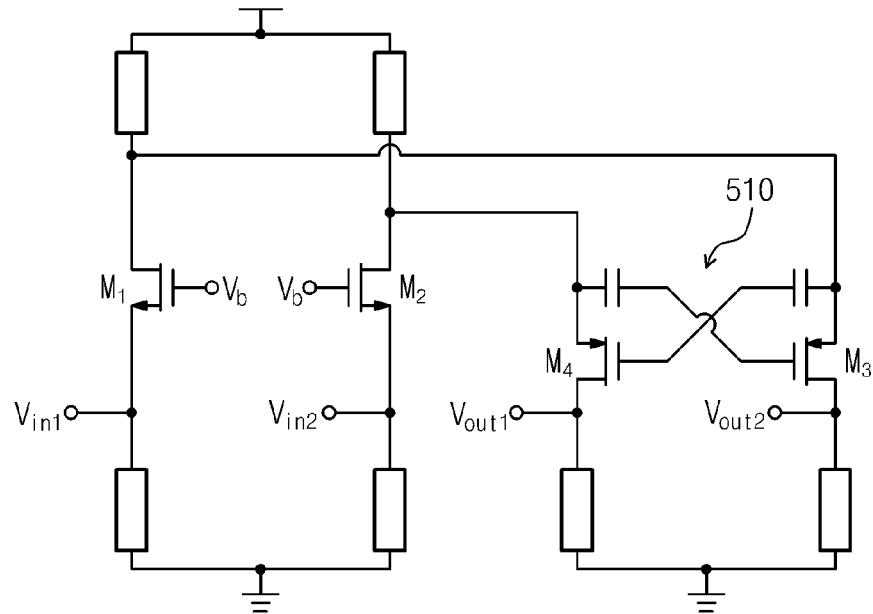
FIG. 6 is a circuit diagram of a low noise amplifier according to another embodiment of the present invention.

FIG. 6 is a circuit diagram of a low noise amplifier according to another embodiment of the present invention.

Referring to FIG. 6, an inverting unit 110 of the low noise amplifier 500 may include an output cross-coupling unit 510 connecting a third transistor $M_3$ to a fourth transistor $M_4$ in a cross-coupled configuration.

The output cross-coupling unit 510 may apply a signal, which is amplified by the first transistor M1, to a gate of the fourth transistor $M_4$, and apply a signal, which is amplified by the second transistor $M_2$, to a gate of the third transistor $M_3$.

For example, as illustrated in FIG. 6, the output cross-coupling unit 510 may connect an output terminal of the first transistor $M_1$ to the gate of the fourth transistor $M_4$ through a capacitor, and connect an output terminal of the second transistor $M_2$ to the gate of the third transistor $M_3$ through a capacitor.

As in this embodiment, when the output transistors are connected to each other in a cross-coupled configuration, A may be equal to 1, thus making it possible to improve the linearity of the low noise amplifier 500 without additional power consumption.

Figure 7:
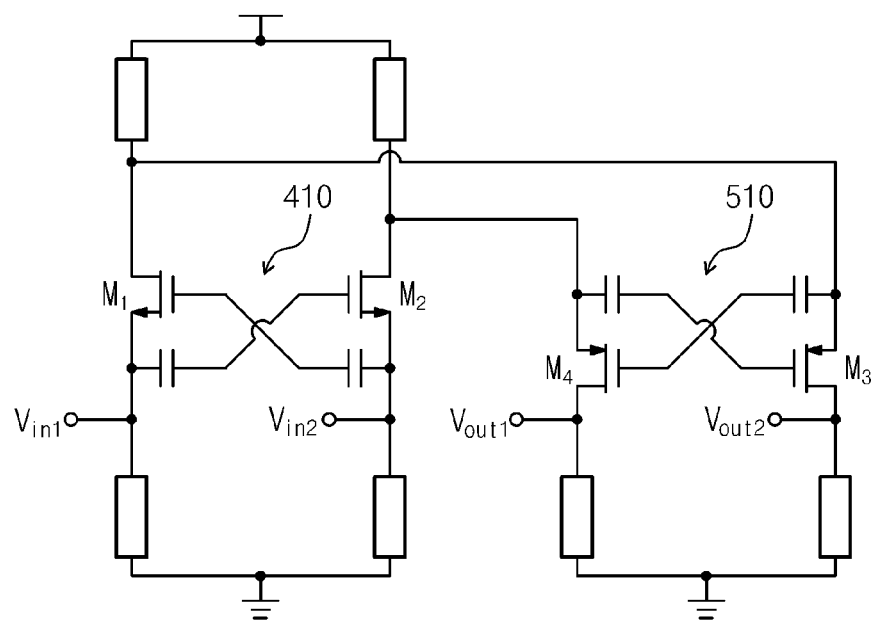
FIG. 7 is a circuit diagram of a low noise amplifier according to another embodiment of the present invention.

FIG. 7 is a circuit diagram of a low noise amplifier according to another embodiment of the present invention.

Unlike the low noise amplifier 500 illustrated in FIG. 6, the low noise amplifier 600 illustrated in FIG. 7 may further include an input cross-coupling unit 410 connecting the first transistor $M_1$ to the second transistor $M_2$ in a cross-coupled configuration.

The input cross-coupling unit 410 illustrated in FIG. 7 may have the same function and structure as that described with reference to FIG. 5.

As described above, the low noise amplifier includes the inverting unit inverting the signal which is amplified by the input transistor (amplified by −A times, A≥1) to apply the inverted signal to the gate of the output transistor. The low noise amplifier may have high linearity, and particularly may improve linearity deterioration caused by a low power supply voltage.

According to the embodiments of the present invention, the linearity of the low noise amplifier may be improved.

According to the embodiments of the present invention, even when being driven by a low power supply voltage, the low noise amplifier may maintain high linearity.

According to the embodiments of the present invention, the low noise amplifier may realize high linearity while minimizing power consumption.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A low noise amplifier comprising:
an input transistor receiving and amplifying a signal;
an output transistor amplifying the signal amplified by the input transistor; and
an inverting unit inverting the signal which is amplified by the input transistor, and applying the inverted signal to a gate of the output transistor,
wherein the input transistor comprises first and second transistors which receive and amplify a differential input signal,
the output transistor comprises third and fourth transistors which amplify signals amplified by the first and second transistors, and
the inverting unit comprises an output cross-coupling unit connecting the third transistor to the fourth transistor in a cross-coupled configuration,
wherein the output cross-coupling unit is configured such that an output terminal of the first transistor is connected to a gate of the fourth transistor through a capacitor, and an output terminal of the second transistor is connected to a gate of the third transistor through a capacitor.

2. The low noise amplifier of claim 1, wherein the input transistor and the output transistor are connected to each other in a cascode configuration.

3. The low noise amplifier of claim 2, wherein the input transistor and the output transistor are connected to each other in a folded cascode configuration.

4. A low noise amplifier comprising:
an input transistor receiving and amplifying a signal;
an output transistor amplifying the signal amplified by the input transistor;
an inverting unit inverting the signal which is amplified by the input transistor, and applying the inverted signal to a gate of the output transistor; and
an input cross-coupling unit,
wherein the input transistor comprises first and second transistors which receive and amplify a differential input signal,
the output transistor comprises third and fourth transistors which amplify signals amplified by the first and second transistors, and
the input cross-coupling unit connects the first transistor and the second transistor to each other in a cross-coupled configuration.

5. The low noise amplifier of claim 4, wherein the input cross-coupling unit applies the signal, which is input to the first transistor, to a gate of the second transistor, and applies the signal, which is input to the second transistor, to a gate of the first transistor.

6. The low noise amplifier of claim 4, wherein the input cross-coupling unit is configured such that an input terminal of the first transistor is connected to a gate of the second transistor through a capacitor, and an input terminal of the second transistor is connected to a gate of the first transistor through a capacitor.

* * * * *